United States Patent
Zhang et al.

[11] Patent Number: 5,962,871
[45] Date of Patent: *Oct. 5, 1999

[54] METHOD FOR PRODUCING SEMICONDUCTOR DEVICE

[75] Inventors: Hongyong Zhang; Toru Takayama; Yasuhiko Takemura, all of Kanagawa, Japan

[73] Assignee: Semiconductor Energy Laboratory Co., Ltd., Kanagawa, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/743,176

[22] Filed: Nov. 5, 1996

Related U.S. Application Data

[60] Continuation of application No. 08/439,941, May 12, 1995, abandoned, which is a division of application No. 08/248,219, May 24, 1994, abandoned.

[30] Foreign Application Priority Data

May 26, 1996 [JP] Japan ..................... 5-147002

[51] Int. Cl.$^6$ ............ H01L 29/786; H01L 29/04
[52] U.S. Cl. ............... 257/66; 257/64; 257/57; 257/255; 257/627; 438/83
[58] Field of Search ............. 257/64, 255, 627, 257/628, 57, 66; 437/83

[56] References Cited

U.S. PATENT DOCUMENTS

| | | |
|---|---|---|
| 3,692,574 | 9/1972 | Kobayashi . |
| 3,749,614 | 7/1973 | Boleky ................. 257/351 |

(List continued on next page.)

FOREIGN PATENT DOCUMENTS

| | | |
|---|---|---|
| 53-27371 | 3/1978 | Japan . |
| 61-63017 | 4/1986 | Japan . |
| 61-84074 | 4/1986 | Japan . |
| 63-170971 | 7/1988 | Japan . |
| 63-295065 | 11/1988 | Japan . |
| 2-140915 | 5/1990 | Japan . |
| 2222546 | 9/1990 | Japan . |

OTHER PUBLICATIONS

"Crystallized Si Films By Low–Temperature Rapid Thermal Annealing of Amorphous Silicon", R. Kakkad, J. Smith, W.S. Lau, S.J. Fonash, J. Appl. Phys. 65(5), Mar. 1, 1989, 1989 American Institute of Physica, pp. 2069–2072.

"Polycrystalline Silicon Thin Film Transistors on Corning 7059 Glass Substrates Using Short Time, Low Temperature Processing", G. Liu, S.J. Fonash, Appl. Phys. Lett. 62 (2), May 17, 1993 American Institute of Physics, pp. 2554–2556.

"Selective Area Crystallization of Amorphous Silicon Films by Low–Temperature Rapid Thermal Annealing", Gang Liu and S.J. Fonash, Appl. Phys. Lett. 55 (7), Aug. 14, 1989, 1989 American Institute of Physics, pp. 660–662.

"Low Temperature Selective Crystallization of Amorphous Silicon", R. Kakkad, G. Liu, S.J. Fonash, Journal of Non–Crystalline Solids, vol. 115, (1989), pp. 66–68.

G. Liu et al.

C. Hayzelden et al. "In Situ Transmission Electron Microscopy Studies of Silicide–Mediated Crystallization of Amorphous Silicon" (3 pages).

A.V. Dvurchenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

T. Hempel et al., "Needle–Like Crystallization of Ni Doped Amorphous Silicon Thin Films", *Solid State Communications*, vol. 85, No. 11, pp. 921–924, 1993.

*Primary Examiner*—Jerome Jackson, Jr.
*Attorney, Agent, or Firm*—Sixbey, Friedman, Leedom & Ferguson, P.C.; Gerald J. Ferguson, Jr.; Jeffrey L. Costellia

[57] ABSTRACT

A silicon film provided on a blocking film 102 on a substrate 101 is made amorphous by doping Si+, and in a heat-annealing process, crystallization is started in parallel to a substrate from an area 100 where nickel serving as a crystallization-promoting catalyst is introduced.

38 Claims, 6 Drawing Sheets

U.S. PATENT DOCUMENTS

| | | | |
|---|---|---|---|
| 4,309,224 | 1/1982 | Shibata . | |
| 4,406,709 | 9/1983 | Celler et al. | 257/64 |
| 4,466,179 | 8/1984 | Kasten | 257/64 |
| 4,727,044 | 2/1988 | Yamazaki . | |
| 4,772,564 | 9/1988 | Barnett et al. . | |
| 4,904,611 | 2/1990 | Chiang et al. . | |
| 4,986,213 | 1/1991 | Yamazaki et al. . | |
| 5,010,033 | 4/1991 | Tokunaga et al. . | |
| 5,075,259 | 12/1991 | Moran | 437/230 |
| 5,145,808 | 9/1992 | Sameshima et al. | 437/173 |
| 5,147,826 | 9/1992 | Liu et al. . | |
| 5,170,244 | 12/1992 | Dohjo et al. | 257/72 |
| 5,177,578 | 1/1993 | Kakinoki et al. . | |
| 5,262,350 | 11/1993 | Yamazaki . | |
| 5,275,851 | 1/1994 | Fonash et al. . | |
| 5,278,093 | 1/1994 | Yonehara | 437/109 |
| 5,288,658 | 2/1994 | Ishihara . | |
| 5,289,030 | 2/1994 | Yamazaki | 257/57 |
| 5,296,405 | 3/1994 | Yamazaki et al. . | |
| 5,318,661 | 6/1994 | Kumoni . | |
| 5,326,991 | 7/1994 | Takasu . | |
| 5,352,291 | 10/1994 | Zhang et al. . | |
| 5,403,772 | 4/1995 | Zhang et al. . | |
| 5,424,244 | 6/1995 | Zhang et al. . | |
| 5,426,064 | 6/1995 | Zhang et al. | 437/21 |
| 5,481,121 | 1/1996 | Zhang et al. | 257/64 |
| 5,488,000 | 1/1996 | Zhang et al. | 437/21 |
| 5,492,843 | 2/1996 | Adachi et al. . | |
| 5,501,989 | 3/1996 | Takayama et al. | 437/21 |
| 5,508,533 | 4/1996 | Takemura . | |
| 5,529,937 | 6/1996 | Zhang et al. | 437/21 |
| 5,531,182 | 7/1996 | Yonehara | 437/109 |
| 5,534,716 | 7/1996 | Takemura . | |
| 5,543,352 | 8/1996 | Ohtani . | |
| 5,545,571 | 8/1996 | Yamazaki et al. | 437/21 |
| 5,563,426 | 10/1996 | Zhang . | |
| 5,569,610 | 10/1996 | Zhang et al. . | |
| 5,569,936 | 10/1996 | Zhang et al. . | |
| 5,580,792 | 12/1996 | Zhang et al. . | |
| 5,585,291 | 12/1996 | Ohtani et al. . | |
| 5,589,406 | 12/1996 | Kato et al. | 437/21 |
| 5,589,694 | 12/1996 | Takayama et al. . | |
| 5,595,923 | 1/1997 | Zhang et al. . | |
| 5,595,944 | 1/1997 | Zhang et al. . | |
| 5,604,360 | 2/1997 | Zhang et al. . | |
| 5,605,846 | 2/1997 | Ohtani et al. . | |
| 5,606,179 | 2/1997 | Yamazaki et al. . | |
| 5,608,232 | 3/1997 | Yamazaki et al. . | |
| 5,612,250 | 3/1997 | Ohtani et al. . | |
| 5,614,426 | 3/1997 | Funada et al. . | |
| 5,614,733 | 3/1997 | Zhang et al. . | |
| 5,616,506 | 4/1997 | Takemura . | |
| 5,620,910 | 4/1997 | Teramoto . | |
| 5,621,224 | 4/1997 | Yamazaki et al. . | |
| 5,624,851 | 4/1997 | Takayama et al. . | |
| 5,637,515 | 6/1997 | Takemura . | |
| 5,639,698 | 6/1997 | Yamazaki et al. . | |
| 5,643,826 | 7/1997 | Ohtani et al. . | |
| 5,646,424 | 7/1997 | Zhang et al. . | |
| 5,654,203 | 8/1997 | Ohtani et al. . | |
| 5,656,825 | 8/1997 | Kusumoto et al. . | |
| 5,663,077 | 9/1997 | Adachi et al. . | |
| 5,677,549 | 10/1997 | Takayama et al. . | |
| 5,696,386 | 12/1997 | Yamazaki . | |
| 5,696,388 | 12/1997 | Funada et al. . | |
| 5,700,333 | 12/1997 | Yamazaki et al. . | |
| 5,705,829 | 1/1998 | Miyanaga et al. . | |
| 5,712,191 | 1/1998 | Nakajima et al. . | |

൩,962,871

METHOD FOR PRODUCING SEMICONDUCTOR DEVICE

This application is a Continuation of Ser. No. 08/439,941, filed May 12, 1995, now abandoned; which itself is a division of Ser. No. 08/248,219, filed May 24, 1994 now abandoned.

BACKGROUND OF THE INVENTION

1. Field of the Invention

This invention relates to a semiconductor device having TFTs (thin film transistors) provided on an insulating substrate of glass or the like, and a method for producing the semiconductor device.

2. Description of Related Art

TFTs have been conventionally formed on a glass substrate to form a semiconductor device such as an active matrix liquid crystal device or an image sensor. The TFTs are used, for example, to drive the pixels of the liquid crystal device.

The TFTs used in the above devices are generally formed of a silicon semiconductor layer in the form of a thin film. The silicon semiconductor of a thin-film type is classified into two types, an amorphous silicon semiconductor (a-Si) type and a crystalline silicon semiconductor type. The amorphous silicon semiconductor can be relatively easily produced at a low film-forming temperature by a vapor-phase deposition method. Therefore, this type is suitable for mass production, and it has been most generally used. However, this type of silicon semiconductor has inferior physical properties such as electrical conductivity, etc. to the crystalline silicon semiconductor. Therefore, in order to more improve a high-speed response characteristic of TFTs, a producing method for TFTs comprising crystalline silicon semiconductor has been strongly required to be established. As the silicon semiconductor having crystallinity have been known polycrystalline silicon, microcrystalline silicon, amorphous silicon containing crystal components, semi-amorphous silicon having an intermediate state between crystallinity and amorphousness, etc.

The following methods may be used to obtain thin film silicon semiconductors having the foregoing crystallinity:

(1) Crystallinity is established during the formation of the semiconductor film.

(2) An amorphous semiconductor film is formed in advance, and then a laser beam is irradiated to the film to crystalize the film.

(3) An amorphous semiconductor film is formed in advance, and then heated to crystalize the film.

However, in the method (1), it is technically difficult to form a film having excellent semiconductor physical properties on the whole surface of a substrate uniformly. In addition, the film formation must be performed at a temperature above 600° C. and thus an inexpensive glass substrate is unusable, so that a manufacturing cost is increased.

In the method (2), an excimer laser is most generally used at present as a laser beam source for irradiating a laser beam to an amorphous semiconductor film. In this case, the irradiation area of the laser beam is small, and thus this method has a disadvantage that a throughput is low. In addition, the stability of the laser beam is insufficient, so that the whole surface of a large-area substrate cannot be treated uniformly. That is, this method is not practically usable at present.

As compared to the methods (1) and (2), the method (3) has an advantage that it is more suitable to manufacture a large-area semiconductor film. However, this method requires a heating temperature above 600° C., and thus an inexpensive glass substrate is not usable. Therefore, this method must be developed to reduce the heating temperature. Particularly in case of present liquid crystal display devices, a large-area screen design is being promoted, and thus use of a large-size glass substrate is required. When a large-size glass substrate is used, contraction and distortion of a substrate occur in a heating process which is indispensable to produce semiconductors, and they cause a critical problem that the precision of a masking process is reduced. Particularly in a case of 7059 glass which is most generally used at present, it has a distortion point of 593° C., and it is greatly deformed in a conventional heat crystallization method. In addition to the heat problem as described above, a heating time required for crystallization is over several tens hours in a present process, and thus the heating time must be shortened.

SUMMARY OF THE INVENTION

An object of the present invention is to provide a method capable of solving the above problems, and specifically to provide a process for producing a silicon semiconductor thin film having crystallinity utilizing a method of heating an amorphous silicon thin film to crystallize the thin film, in which both of lowering of the temperature for crystallization and shortage of the heating time for crystallization can be performed. A silicon semiconductor having crystallinity which is manufactured using the process according to this invention has the same physical properties as or physical properties superior to that manufactured by a conventional technique, and it is usable in an active layer area of TFTs.

The inventors of this application have made the following experiments and consideration for a method of forming an amorphous silicon semiconductor film as described above by a CVD method or a sputtering method, and then heating the film to crystalize the film.

An amorphous silicon film is initially formed on a glass substrate, and then the film is crystallized by heating. The inventors investigated the mechanism of this crystallization. Through the experiments, it was observed that crystal growth of silicon starts at an interface between the glass substrate and the amorphous silicon and proceeds vertically to the substrate surface into a pillar shape in the case that the thickness of the film is larger than a certain thickness.

The above phenomenon is considered as progressing on the basis of a mechanism that crystalline nuclei serving as geneses for crystal growth (species serving as geneses for crystal growth) exist between the glass substrate and the amorphous silicon film, and crystal grow from the crystalline nuclei. These crystalline nuclei are considered as being impurity metal elements or crystal components (as is called as a crystallized glass, it is considered that crystal components of silicon oxide exist on the surface of the glass substrate) existing on the surface of the substrate in a very small amount.

Accordingly, it is expected that a crystallization temperature can be lowered by introducing crystal nuclei more positively. In order to confirm an effect of introducing crystal nuclei, the following experiment was tried. That is, a thin film of different metal in a very small amount was beforehand formed on a substrate, then an amorphous silicon thin film was formed on the different metal film, and then heat-crystallization was conducted on the amorphous silicon thin film. As a result, it was proved that the crystallization temperature was lowered when thin films of some different kinds of metal were beforehand formed on the substrate, and it was expected that crystal growth using foreigners as crystal nuclei had conducted. Accordingly, a more detailed mechanism for plural kinds of impurity metal which could lower the crystallization temperature was studied.

The crystallization mechanism can be considered to be classified into two stages which are an initial nucleus generation stage and a subsequent crystal growth stage from the nuclei. The speed of the initial nucleus generation can be detected by measuring a time elapsing until spotted fine crystals occur at a constant temperature. This time could be shortened in all cases where the thin films of the above kinds of impurity metal were formed on the substrate, and the effect of the introduction of the crystal nuclei on the lowering of the crystallization temperature can be proved. As an unexpected result, through an experiment for examining variation of growth of crystal grains with variation of the heating time after generation of crystal nuclei, it was observed that the speed of the crystal growth after the generation of the nuclei was also rapidly increased when a thin film of a certain kind of metal was formed on a substrate, an amorphous silicon thin film was formed on the metal thin film and then the amorphous silicon thin film was crystallized. A mechanism for this effect has not yet been elucidated at present, however, it is guessed that any catalytic effect acts.

At any rate, it was proved that when a thin film was formed of a certain kind metal in a very small amount, an amorphous silicon thin film was formed on the metal thin film and then the amorphous silicon thin film was crystallized by heating, sufficient crystallinity which had not been expected in the prior art could be obtained at a temperature below 580° C. and for about 4 hours due to the two effects as described above. Nickel (Ni) is the best material which is experimentally proved as providing the most remarkable effect in all impurity metals having such an effect. In addition to nickel, Fe, Co, Pd and Pt may be listed as a metal element having such a catalytic action on crystallization.

The following is an example showing an effect of formation of a nickel thin film. In a case where an amorphous silicon thin film was formed by a plasma CVD method on a substrate (coring 7059 glass) which had been subjected to no treatment, that is, on which no nickel thin film had been formed, and then heated under a nitrogen atmosphere to crystallize the amorphous silicon thin film, a heating time over ten hours was required for a heating temperature of 600° C. On the other hand, in a case where an amorphous silicon thin film was formed on a substrate on which a nickel thin film in a very small amount (hereinafter referred to as a trace nickel thin film) had been formed, the same crystal state as the former case could be obtained by heating the amorphous silicon thin film for about 4 hours. The crystallization of the amorphous silicon thin film was judged using a Raman spectrum in this experiment. From this experiment, it is apparent that nickel has a large effect.

As is apparent from the foregoing, formation of an amorphous silicon thin film after a trace nickel thin film is formed enables the lowering of the crystallization temperature and the shortening of the crystallization time. This process will be described in more detail on the assumption that this process is applied to a TFT producing process. As described later, the same effect can be obtained by forming a nickel thin film on not only a substrate, but also on an amorphous silicon thin film, or by implanting the nickel into the amorphous silicon by an ion implantation method.

Accordingly, these treatments are commonly referred to as "trace nickel addition" in the specification of this application.

First, a method for the trace nickel addition will be described.

It has been known that the trace nickel addition can provide the same effect on the lowering of the crystallization temperature in both cases where a trace nickel thin film is formed on a substrate and then an amorphous silicon thin film is formed on the trace nickel thin film, and where an amorphous silicon film is formed and then a trace nickel thin film is formed on the amorphous silicon film, and any film-forming method such as a sputtering method, a deposition method, spin coating, coating or the like may be used as a film-forming method. However, in the method of forming the trace nickel thin film on the substrate, the effect becomes more remarkable by forming a silicon oxide film on a 7059 glass substrate and then forming the trace nickel thin film on the silicon oxide film than by directly forming the trace nickel thin film on the substrate. As one of reasons for this fact, it would be considered that direct contact between silicon and nickel is important for the low-temperature crystallization, and components other than silicon serves to obstruct direct contact or reaction between silicon and nickel in the case of using a 7059 glass substrate.

It was proved that the substantially same effect could be obtained by adding nickel with the ion implantation method as well as the method of forming the trace nickel thin film in contact with the lower surface or upper surface of the amorphous silicon thin film as described above. The lowering of the crystallization temperature was observed for addition of nickel of $1 \times 10^{15}$ atoms/cm$^3$ or more. However, it was observed that for addition of nickel of $1 \times 10^{21}$ atoms/cm$^3$ or more, the shape of the peak of a Raman spectrogram was clearly different from that of silicon itself, so that a practically usable range of nickel addition is from $1 \times 10^{15}$ atoms/cm$^3$ to $5 \times 10^{19}$ atoms/cm$^3$. If a nickel concentration is $1 \times 10^{15}$ atoms/cm$^3$ or less, nickel elements are localized and thus the catalytic function of nickel is deteriorated. Further, if a nickel concentration is $5 \times 10^{19}$ atoms/cm$^3$ or more, nickel and silicon are reacted with each other to form NiSi compounds, and the semiconductor characteristics are hindered. In a crystallized state, products can be more practically used as a semiconductor as the nickel concentration is lower.

On the basis of the above consideration and the fact that products are used as active layers or the like of TFTs, the nickel addition amount is required to be adjusted in the range of $1 \times 10^{15}$ atoms/cm$^3$ to $1 \times 10^{19}$ atoms/cm$^3$.

Next, crystal form when the trace nickel addition is performed will be described.

As explained below, in the case that nickel is not added, crystallization occurs from crystal nuclei existing at the substrate surface. This crystallization proceeds in a random direction provided that the film is not thicker than a certain thickness. Further, if the thickness of the film is enough large, the columnar crystals grow in such a manner that the (110) direction aligns vertically to the substrate surface. This crystallization can be observed on the entire surface of the substrate. On the other hand, in the case of the trace nickel addition according to this embodiment, different crystal growth was observed between an area added with nickel (hereinafter referred to as "nickel area") and an area in the neighborhood of the nickel area (hereinafter referred to as "adjacent area"). That is, it became clear from a transmission electron microscopic photograph that, in the nickel area, added nickel or a compound of nickel and silicon served as a crystal nucleus and the pillar-shaped crystal growth progressed substantially vertically to the substrate. In addition, the low-temperature crystallization was also confirmed in the adjacent area in which the nickel was not directly added, and a peculiar crystal growth in which needle or pillar shape crystals grew substantially in parallel to the substrate so that the (111) plane was aligned vertically to the substrate was also observed in this area.

It was observed that the crystal growth in the lateral direction parallel to the substrate was started from the nickel area and the maximum crystal size of grown crystals extended to several hundreds μm, and it became clear that the degree of crystal grow increases with the increase of the time and the temperature. For example, crystal growth of about 40 μm crystals was observed at the temperature of 550° C. and for 4 hours. In addition, according to a transmission electron microscopic photograph, each of these large-size laterally-extending crystals was determined to be like monocrystal. Further, the nickel concentration in each of a trace nickel added area, a laterally-extending crystal growth area in the neighborhood of the trace nickel added area and an amorphous area (no low-temperature crystallization appeared in a region extremely distant from the Ni added area) was measured by SIMS (Secondary (on Mass Spectroscopy). As a result, the nickel concentration in the laterally-extending crystal growth area was measured to be lower than the trace nickel added area by one figure, and diffusion in amorphous silicon was observed. Further, the nickel concentration in the amorphous area was measured to be lower than the laterally-extending crystal growth area by one figure. The relationship between the crystal form and the above result has been unclear at present, however, at any rate, a silicon film having crystallinity of a desired crystal form at a desired area can be formed by adjusting a nickel addition amount and controlling a position where nickel is added.

Next, electrical characteristics of the trace nickel added area and the laterally-extending crystal growth area adjacent thereto will be described.

With respect to conductivity, the trace nickel added area had the substantially same conductivity value as a no-nickel added film, that is, the film which was subjected to crystallization at about 600° C. for several tens hours. Further, calculating an activation energy on the basis of temperature-dependence of conductivity, there was observed no behavior which was expected to be induced due to the nickel energy level when the nickel addition amount was set in the range of about $10^{17}$ atoms/cm$^3$ to $10^{18}$ atoms/cm$^3$. That is, according to only this fact, in a case where the nickel concentration in a crystal silicon semiconductor film is below $1\times10^{18}$ atoms/cm$^3$, there would occur no problem even if a semiconductor device, for example, a TFT is formed using this film.

On the other hand, the laterally-extending crystal growth area had a higher conductivity than the trace nickel added area by one or more figures, and it has a very higher value as a silicon semiconductor having crystallinity. The reason for this fact would be considered as follows. That is, a current passing direction was coincident with the laterally-growing direction of crystals, and thus there was little or no grain boundary in an electron path between electrodes. This fact is perfectly consistent with the result of the transmission electron microscopic photograph.

However, through more delicate observation of the laterally-growing area of the crystals on the transmission electron microscopic photograph, areas containing crystals growing in a branch form was also observed upon viewing from the upper side of the substrate although the crystallization direction of needle or pillar crystals was parallel to the surface of the substrate. That is, it was observed that the needle or pillar crystals grew in the same direction on the average, however, some crystals grew while being branched in a slant direction.

The inventors have deliberately considered the observation result, and had the following conclusion.

Crystal components of a substrate material existing in a substrate or at an interface portion between the substrate and a semiconductor film, or crystal components in the semiconductor film can serve as nuclei for crystal growth, however, these components obstruct the crystal growth in an uniform direction (unidirection) and promote a random crystal growth in the lateral crystal growth process.

Therefore, this invention is characterized in that crystal components at and in the vicinity of the interface between a substrate area on which the growth is to occur and an amorphous silicon semiconductor film (in this invention, the term "amorphous" does not mean a perfect amorphous state, but may contain crystal components if the amount of the components is small) are removed to the utmost by an ion implantation of inert elements so that this area is made perfectly amorphous, and then by performing the crystal growth in a lateral direction (a direction parallel to the substrate) in a state where no component serving as a crystal nucleus exists, needle or pillar crystals are grown so that the crystal growing directions thereof are coincident with one another as a whole. Particularly by concentratively implanting inert ions into the substrate, the area in the neighborhood of the surface of the substrate (when a blocking film is formed on the surface of the substrate, the blocking film is regarded as the substrate surface), the interface between the substrate and the semiconductor film and the semiconductor film itself are made perfectly amorphous, so that components having crystallinity which might serve as crystal nuclei are removed as perfectly as possible.

In accordance with another aspect of the invention, it is possible to further improve the characteristics of the thus obtained semiconductor layer by further treating the semiconductor layer with a laser light or an intense light as strong as the laser light. Thereby, components existing at grain boundaries or the like and not having been sufficiently crystallized can be further crystallized. It is assumed that the crystalline components which are produced by the preceding heating step function as nuclei so that the remaining amorphous components can be further crystallized by the photo-annealing.

The invention and its application to the actual semiconductor devices will be more fully understood from the following detailed description, when taken with the appended drawings, in which:

DETAILED DESCRIPTION OF PREFERRED EMBODIMENTS

[First Embodiment]

This embodiment relates to a method of forming a complementary circuit comprising a P-channel type TFT (PTFT) and a N-channel type TFT (NTFT) which are formed of crystal silicon on a glass substrate, and are complementarily connected to each other. The scheme of this embodiment is applicable to, for example, a peripheral driver circuit for an active type of liquid crystal display device or an image sensor.

FIGS. 1A to 1D are cross-sectional views showing a series of processes to manufacture a semiconductor device according to a first embodiment of this invention.

Figure 1A:
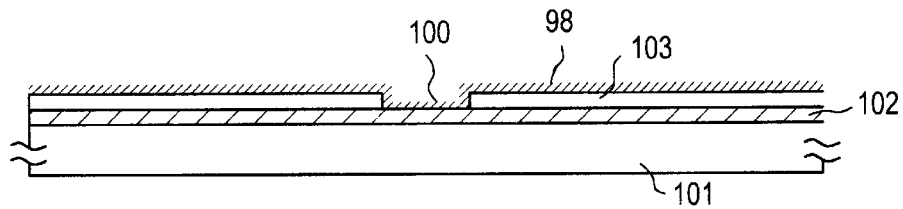
FIGS. 1A to 1D are cross-sectional views showing a series of processes of a semiconductor device producing method according to a first embodiment of this invention.

A blocking film 102 of silicon oxide is first formed at a thickness of 2000 Å on a substrate (coring 7059) 101 by a sputtering method, and then a silicon oxide film 103 serving as a mask is provided on the blocking film 102. The silicon oxide film 103 is used to expose the blocking film 102 in a slit form, and it must be designed at a thickness of 1000 Å or more. Further, it is effective to add the mask 103 with a material having a gettering effect such as phosphorus, chlorine or the like. Viewing this structure from the upper side as shown in FIG. 1A, the blocking film 102 is exposed to the outside in a slit form at region 100, and the other portion is masked.

After the silicon oxide film 103 is formed, a nickel silicide film (chemical formula: $NiSi_x$, $0.4 \leq x \leq 2.5$, for example $x=2.0$) is selectively formed at a thickness of 5 to 200 Å for example, 20 Å in the area 100 by a sputtering method. That is, the trace nickel addition is selectively performed on the silicon oxide 102 in the area 100.

Thereafter, the silicon oxide film 103 serving as the mask is removed, and an intrinsic (I-type) amorphous silicon film 104 is formed at a thickness of 500 to 1500 Å, for example, 1000 Å. A film having crystallinity may be used as the amorphous silicon film 104, that is, any film may be used insofar as it is a non-single crystalline silicon film. Further, a silicon oxide film 99 serving as a protective film is formed at a thickness of 100 to 1000 Å. The silicon oxide film is provided to prevent the surface of the silicon film 104 from being damaged when a subsequent ion implantation is performed.

Thereafter, silicon ions which are inert elements to the silicon film 104 are implanted to the whole surface. The implantation of the silicon ions is performed to remove crystal components (silicon oxide crystal components in the substrate and crystal components in the amorphous semiconductor film) which exist at the interface between the substrate (containing the blocking film 102) and the amorphous silicon semiconductor film so that the crystal growth in the uniform direction can be performed in a subsequent heat-annealing process.

Figure 5:
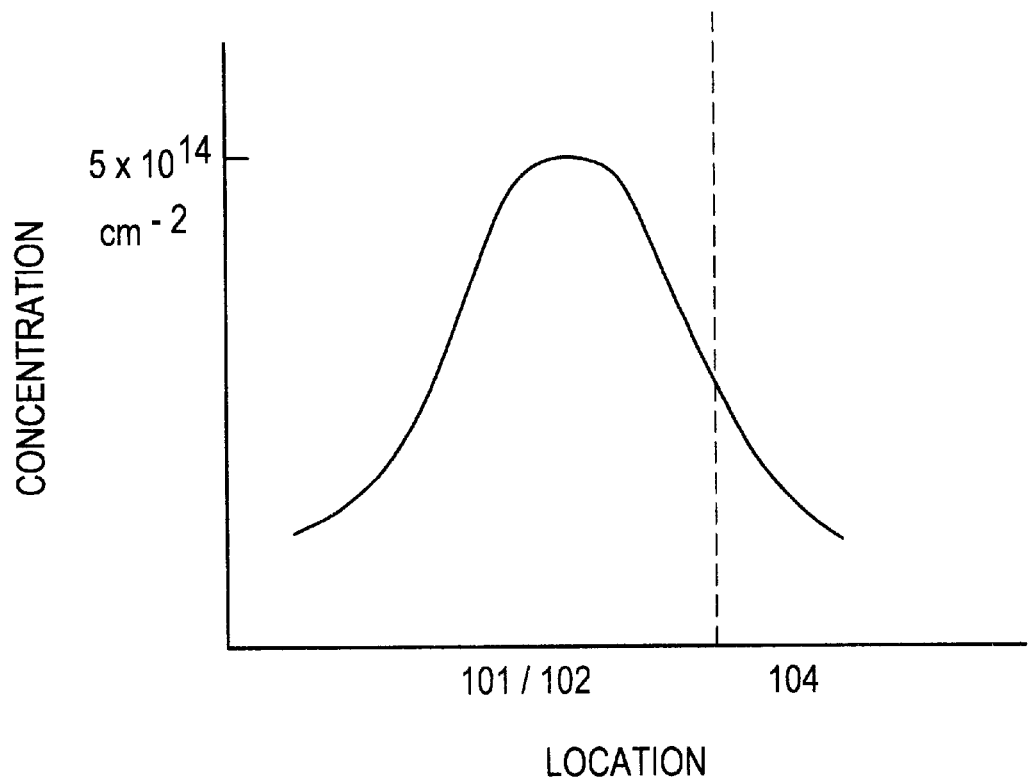
FIG. 5 is a graph showing dose of silicon ions.

Implantation conditions are set so that the silicon ions are implanted at a dose configuration as shown in FIG. 5. In FIG. 5, an area represented by a dotted line corresponds to an interface portion between the blocking film 102 and the amorphous silicon film 104. The maximum value of the dose was set to $5 \times 10^{14} cm^{-2}$ at the substrate side. That is, the acceleration voltage is controlled so that the peak of the concentration locates under the silicon semiconductor layer. In the silicon-ion implantation process, the interface between the blocking film 102 (in this embodiment, the blocking film 102 is regarded as constituting the surface of the substrate) and the amorphous silicon film 104, the amorphous silicon film 104 itself, the interface between the amorphous silicon film 104 and the silicon oxide film 99, and a surrounding portion to the interface are made amorphous. The dose of the silicon ions is preferably in the range of $1 \times 10^{14}$ to $9 \times 10^{16} cm^{-2}$. Also, the accelerating voltage is 137 keV, for example.

Since the surface of the amorphous silicon film is coated with the silicon oxide film 99 during the silicon-ion implantation, damage of the amorphous silicon film by accelerated ions can be suppressed. Further, it is preferable to provide a mask on the region 100 in order to prevent the implantation of the silicon ions into this area. Thereby, it is possible to prevent undesirable diffusion of nickels into other portions of the film during the implantation of silicon ions.

Thereafter, the silicon oxide film 99 is removed, and an annealing treatment is conducted at 550° C. for 4 hours under a hydrogen reducing atmosphere (preferably, partial pressure of hydrogen is set to 0.1 to 1 atm) or a nitrogen atmosphere (atmospheric pressure) to crystallize the amorphous silicon film 104. In this case, the silicon film 104 is crystallized in a direction vertical to the substrate 101 in the area 100 where the nickel silicide film has been selectively formed. In areas other than the area 100, the crystal growth proceeds in a lateral direction (a direction parallel to the substrate) from the area 100. The crystallization temperature may be set in the range of 450° C. to 700° C. If the crystallization temperature is too high, a problem in heat resistance of the glass substrate occurs like the prior art. In the present invention, it is possible to crystallize the film at a lower temperature than the conventional process at 600° C., that is, at 500° C.–580° C., preferably, 520° C.–560° C.

Since the interface between the blocking film 102 and the silicon film 104, the peripheral portion thereof and the amorphous silicon film itself are perfectly made amorphous in the laterally crystal-growing area, there occurs no crystal component serving as an element of disturbing a crystallization direction as shown by an arrow 105 when crystallization occurs, so that the lateral crystal growth can be uniformly performed.

Through the above process, the amorphous silicon film can be crystallized to obtain the crystal silicon film 104. Thereafter, a patterning process is performed to separate elements from one another, and the silicon oxide film 106 is formed at a thickness of 1000 Å as a gate insulating film by the sputtering method. In the sputtering process, silicon oxide is used as a target, and the following sputtering conditions are adopted: a substrate temperature of 200° to 400° C., for example, 350° C., and a sputtering atmosphere of oxygen and argon (argon/oxygen=0 to 0.5, for example, below 0.1). Subsequently, an aluminum film (containing silicon of 0.1 to 2%) is formed at a thickness of 6000 to 8000 Å, for example 6000 Å, by the sputtering method. It is preferable to successively carry out the film forming processes of the silicon oxide film 106 and the aluminum film.

Thereafter, the aluminum film is subjected to the patterning to form gate electrodes 107 and 109. Further, the surfaces of the aluminum electrodes are subjected to anodic oxidation to form oxide layers 108 and 110 on the surfaces thereof. The anodic oxidation is performed in an ethylene glycol solution containing tartaric acid of 1 to 5%. The oxide layers 108 and 110 thus obtained have a thickness of 2000 Å. The thickness of the oxide layers 108 and 110 serves to determine an offset gate area in a subsequent ion doping process, and thus the length of the offset gate area can be determined in the anodic oxidation process as described above.

Thereafter, impurities (phosphorus and boron) are doped into the crystal silicon film area using the gate electrode 107 and its peripheral oxide layer 108, and the gate electrode 109 and its peripheral oxide layer 110 as a mask by the ion doping method. Phosphine ($PH_3$) and diborane ($B_2H_6$) are used as doping gas. In the former case, an accelerating voltage is set to 60 to 90 kV, for example, 80 kV, and in the latter case the accelerating voltage is set to 40 to 80 kV, for example, 65 kV. The dose is set to $1\times10^{15}$ to $8\times10^{15}$ $cm^{-2}$, for example, it is set to $2\times10^{15}$ $cm^{-2}$ for phosphorus and $5\times10^{15}$ $cm^{-2}$ for boron. In the doping process, each of these elements is selectively doped into the corresponding area while shielding the other area by a photoresist. As a result, N-type impurity areas 114 and 116 and P-type impurity areas 111 and 113 are formed, and thus a P-channel type TFT (PTFT) area and an N-channel type TFT (NTFT) area can be formed.

Thereafter, an annealing process is performed by irradiation of laser beam. A KrF excimer laser (wavelength: 248 nm, pulse width: 20 nsec) are used, however, other lasers may be used. The following irradiation conditions of laser beam are used: energy density of 200 to 400 $mJ/cm^2$, for example, 250 $mJ/cm^2$, and 2 to 10 shots, for example, 2 shots per one point. Further, it is effective to heat the substrate at about 200° to 450° C. in the laser beam irradiating operation. In the laser annealing process as described above, the irradiation of the laser beam more promotes recrystallization because nickel has been diffused into the previously-crystallized area, and thus the impurity areas 111 and 113 which are doped with the impurities providing P-type conductivity and the impurity areas 114 and 116 which are doped with the impurities providing N-type conductivity can be easily activated.

Subsequently, a silicon oxide film 118 having 6000 Å thickness is formed as an interlayer insulator by a plasma CVD method, contact holes are formed in the silicon oxide film 118, and then electrodes/wirings 117, 120 and 119 are formed of conductive material, for example, a multi-layer film of titanium nitride and aluminum. Finally, an annealing process is performed at 350° C. for 30 minutes under a hydrogen atmosphere of 1 atm. A semiconductor circuit is completed in a series of processes as described above (FIG. 1D).

Figure 1B:
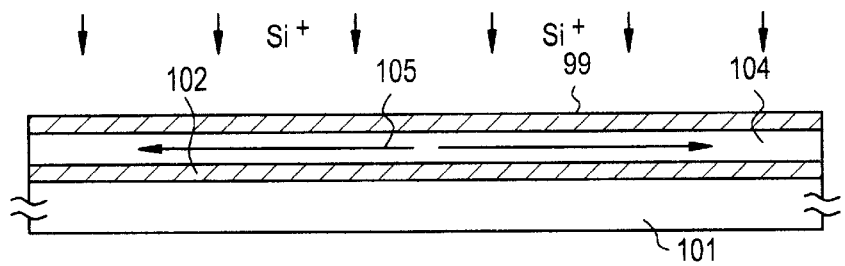
Figure 1C:
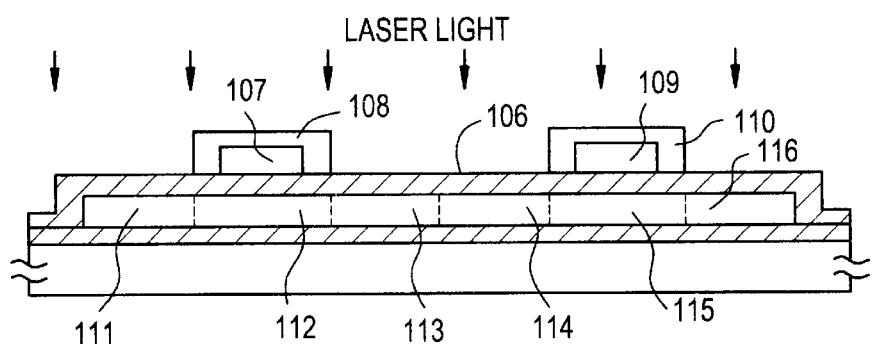
Figure 1D:
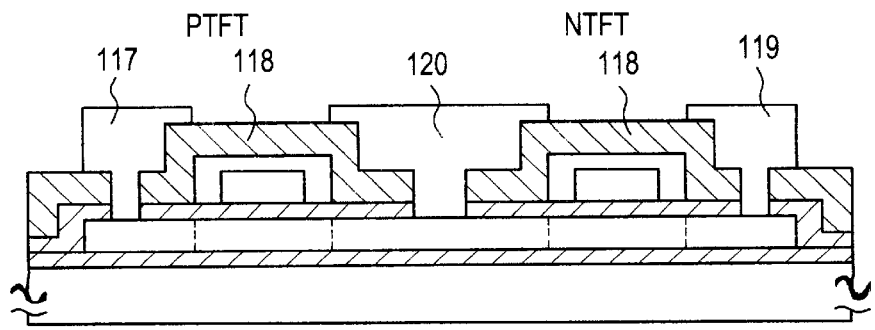

The circuit shown in FIG. 1D includes a CMOS structure in which the PTFT and the NTFT are complementarily formed, however, in the above processes, two independent TFTs may be simultaneously formed by forming two TFTs simultaneously and cutting and separating these TFTs at the center thereof.

Figure 2:
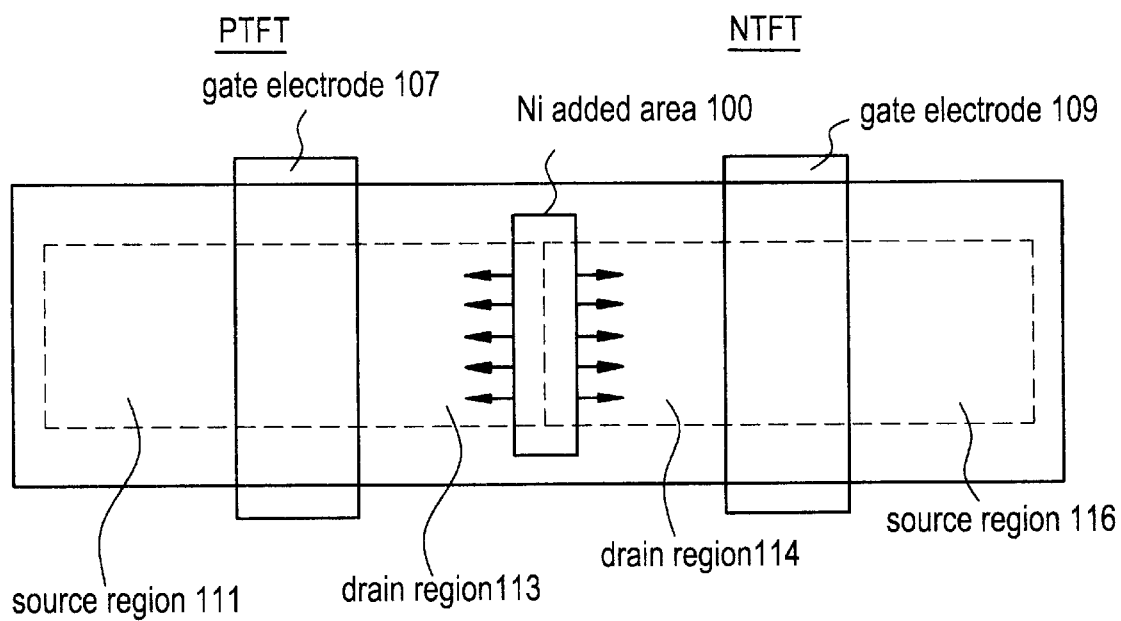
FIG. 2 is a top view of a semiconductor device as shown in FIG. 1D, which is formed by the semiconductor device producing method according to the first embodiment of this invention.

FIG. 2 is a top view of the semiconductor device shown in FIG. 1D. The Ni-added area in FIG. 2 corresponds to the area 100 shown in FIG. 1A. The lateral crystallization is started from the Ni-added area and progresses substantially uniformly in parallel to the substrate as shown in FIG. 2. Since needle or pillar shaped crystals grow in a moving direction of carriers which move between a source and a drain, the carriers hardly traverse grain boundaries, and thus TFTs having high mobility can be obtained.

For example, when crystallization was performed without implantation of silicon ions in the process of FIG. 1B, the mobility of an obtained PTFT was 50 to 60 $cm^2/Vs$. On the other hand, the mobility of a PTFT obtained in this embodiment was 90 to 120 $cm^2/Vs$. Further, an NTFT obtained without silicon-ion implantation had a mobility of 80 to 100 $cm^2/Vs$, however, an NTFT obtained in this embodiment had a mobility of 150 to 180 $cm^2/Vs$.

In this embodiment, as an Ni doping method, the Ni thin film (as it is extremely thin, it is difficult to observe it as a film) is selectively formed on the blocking film 102 below the amorphous silicon film 104, and the crystal growth is started from this portion. However, it may be adopted that the amorphous silicon film 104 is formed and then the nickel silicide is selectively formed. That is, the crystal growth may be started from the upper surface of the amorphous silicon film, or from the lower surface of the amorphous silicon film. Further, it may be adopted that an amorphous silicon film is beforehand formed, and nickel ions are selectively doped into the amorphous silicon film 104 by the ion doping method. In this case, the concentration of Ni can be controlled. Further, the trace Ni addition can be performed by a plasma treatment. When nickel element is doped using the plasma treatment, it is sufficient to conduct the plasma treatment on the upper surface of a blocking film (silicon oxide film 102, for example) of a semiconductor film (amorphous silicon film 104, for example) which is to be subjected to the trace nickel addition, or on the upper surface of the semiconductor film.

Further, TFTs can be manufactured in the same process when Fe, Co, Pd or Pt is used as catalytic material for crystallization in place of Ni.

[Embodiment 2]

In this embodiment, an N-channel type TFT is provided to each picture element as a switching element in an active-type liquid crystal display device. In the following description, the structure is described for one picture element, however, other many (generally, several hundred thousands) picture elements can be made by the similar process.

FIGS. 3A to 3D are cross-sectional views showing a series of producing processes of a semiconductor device according to this embodiment. In this embodiment, a Corning 7059 glass substrate is used as a substrate 201. First, a blocking film 202 (silicon oxide film) is formed on the glass substrate 201 by the sputtering method, and then a silicon oxide film 203 serving as a mask is formed at a thickness of 1000 Å. The silicon oxide film serves as a mask for exposing the blocking film 202 to the outside in an area 204. Thereafter, a nickel silicide film is formed. (not shown in the figure) The nickel silicide film is formed at a thickness of 5 to 200 Å, for example, 20 Å by the sputtering method, and its chemical formula is represented by $NiSi_x$, $0.4 \leq x \leq 2.5$, for example, x=2.0.

Figure 3A:
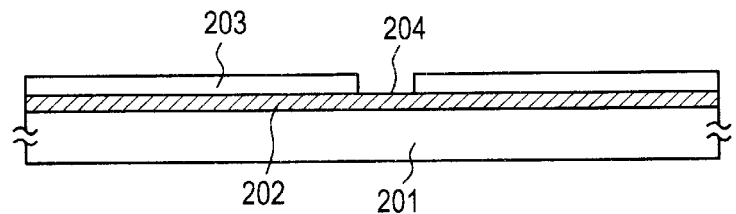
FIGS. 3A to 3D are cross-sectional views showing a series of processes of a semiconductor device producing method according to a second embodiment of this invention.
Figure 3B:
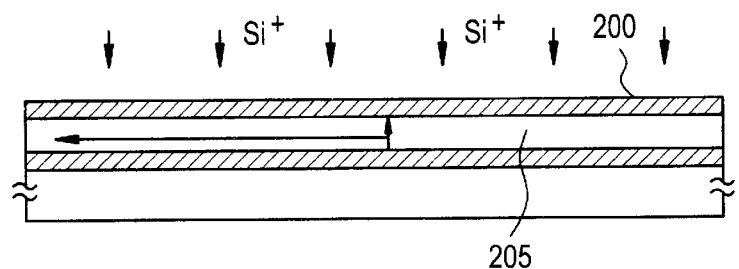
Figure 3C:
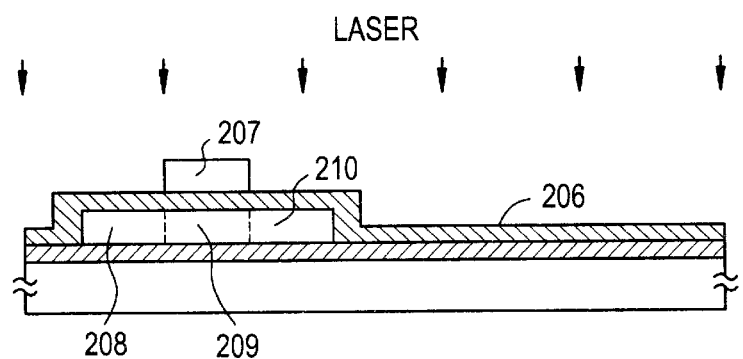
Figure 3D:
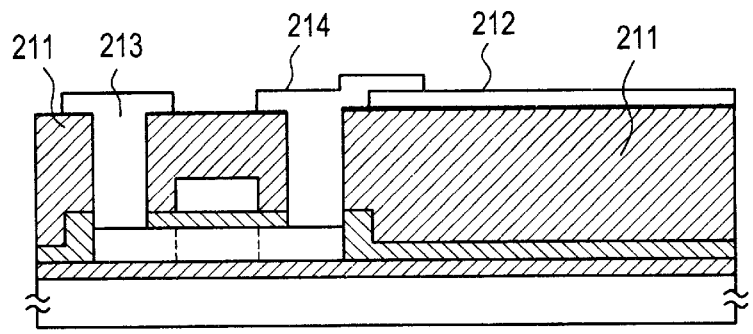

Thereafter, the silicon oxide film 203 serving as the mask is removed, an amorphous silicon film 205 (thickness: 300 to 1500 Å) is formed by an LPCVD method or a plasma CVD method, and then a protection film 200 of silicon oxide is formed at a thickness of 500 Å (FIG. 3B).

Subsequently, the same silicon-ion implantation process as the first embodiment is performed, and then the crystallization is performed by the heat-annealing treatment. This annealing process is performed at 550° C. for 4 hours under a hydrogen-reducing atmosphere (preferably, a partial pressure of hydrogen is 0.1 to 1 atom). In this case, since a nickel silicide film is partially formed below the amorphous silicon film 205, the crystal growth at a portion where the nickel silicide film is formed progresses in a vertical direction to the substrate, and the crystal growth at the other portions progresses in parallel to the substrate to obtain a crystal silicon film.

The silicon semiconductor layer 205 thus crystallized is patterned so that a semiconductor island including an active region of a TFT is formed as shown in FIG. 3B. Then a gate insulating film 206 of silicon oxide (at a thickness of 700 to 1200 Å, for example, 1000 Å in this embodiment) is formed by a plasma CVD method using tetra-ethoxy-silane (TEOS) as row material under an oxygen atmosphere.

Subsequently, a gate electrode 207 of silicon is formed, and then phosphorus is doped as N-type impurities into the crystal silicon film in a self-alignment manner by the ion doping method to form source and drain regions 208 and 209 of the TFT. Further, as shown in an arrow of FIG. 3C, KrF laser beam is irradiated to the above crystal silicon film, thereby improving crystallinity of the silicon film which is deteriorated due to the ion doping process as described above. At this time, the energy density of the laser beam is set to 250 to 300 mJ/cm$^2$. By the laser irradiation as described above, the sheet resistance of the source and drain regions of the TFT is set to 300 to 800 Ω/cm$^2$.

Thereafter, an insulating layer 211 are formed with silicon oxide, and a pixel electrode 212 are formed with ITO. Subsequently, contact holes are formed in the insulating layer 211 and electrodes 213 and 214 are formed with a multi-layer film of chromium/aluminum at the source and drain regions of the TFT so that the electrode 214 is connected to the ITO. The chromium/aluminum multi-layer film comprises a chromium film serving as a lower layer which has a thickness of 100 to 2000 nm, typically 100 nm, and an aluminum film serving as an upper layer which has a thickness of 100 to 2000 nm, typically 500 nm. It is preferable to continuously form these films by the sputtering method. Finally, the annealing treatment is conducted at 200° to 300° C. for 2 hours in a hydrogen atmosphere to complete hydrogenation of silicon. In the manner as described above, the TFT is completed. A number of TFTs which are simultaneously formed in the manner as described above are arranged in a matrix form to form an active matrix type of liquid crystal display device.

Figure 4:
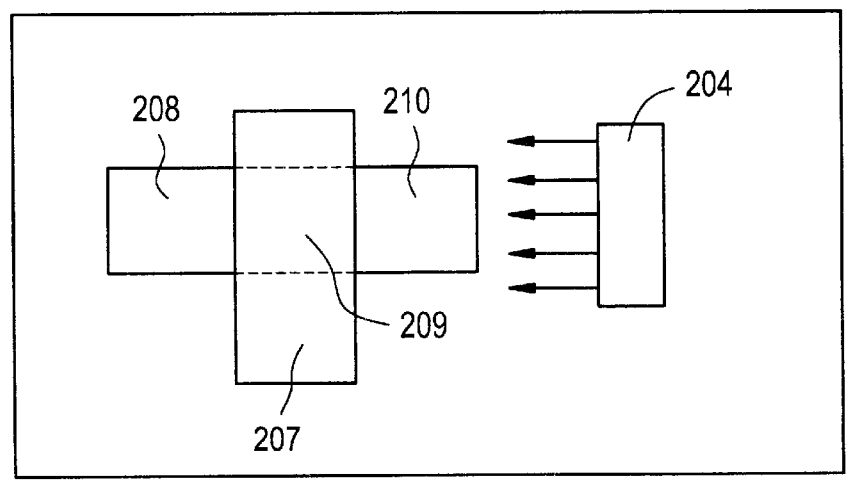
FIG. 4 is top view of a TFT which is formed by the semiconductor device producing method according to the second embodiment of this invention.

FIG. 4 is a top view of the TFT which is formed by the producing method of this embodiment.

In FIG. 4, there are shown a TFT portion, an area 204 which is subjected to the trace nickel addition, source/drain regions 208 and 210, a channel forming region 209, and a gate electrode 209 above the channel forming region. In a crystallization process using the heat-annealing treatment, the crystal growth having a uniform crystal growing direction progresses from the area 204 in which nickel is selectively introduced, in parallel to the substrate as indicated by an arrow of FIG. 4, and the source/drain regions 208 and 210 and the channel forming region 209 are constructed with a crystal silicon film which grows in parallel to the substrate. At an operation time of the TFT, carriers move along the channel forming region, that is, between the regions 208 and 210, so that the carriers can be moved in the crystal silicon film whose crystal growing direction is uniform, with suffering no effect of grain boundaries, that is, a high mobility can be obtained. Further, the lateral crystal growth progresses by about 40 μm, and thus it is preferable to set the length of an active layer to 40 μm or less. In addition, the area added with a very small amount of nickel (trace nickel added area) may be overlapped with the drain/source region 210. However, if the channel forming area 209 is overlapped with the trace nickel added area 204, the crystal growing direction would be vertical to the substrate, and thus attention must be paid to this point.

In the embodiment as described above, the TFT is formed so that the carriers flow in parallel to the crystal growing direction, however, the characteristics of the TFT can be freely controlled by suitably determining the flow direction of the carriers in the TFT and the crystal growing direction. That is, a rate at which the carriers traverse grain boundaries can be controlled by adjusting an intersecting angle between the carrier flow direction (a direction connecting the source and the drain) and the crystal growing direction in the TFT, so that resistance against movement of the carriers can be controlled to some degree.

[Embodiment 3]

In this embodiment, the ion doping of silicon ions is selectively performed so that an area where no silicon ion is doped is selectively left as a silicon film having crystal components, thereby enabling the lateral crystal growth to progress from this area toward an amorphous area where silicon ions are doped.

For example, in the producing process shown in FIG. 1, the trace nickel addition is selectively conducted on the area 100 like the embodiment 1, and in the producing process shown in FIG. 1B, the area 100 is masked by a resist to perform the ion doping of silicon ions. In this case, it is better to form the silicon film 104 as a film having crystallinity. In this case, the crystal growth as indicated by the arrow 105 occurs from the region 100 of the silicon film 104 toward its peripheral portion (the area doped with no silicon ion) when the heat-crystallization is performed.

Further, the same effect can be obtained by performing the trace nickel addition for the whole silicon film 104. In this case, the crystal growth in the vertical direction to the substrate 101 simultaneously occurs while nickel acts as a catalyst.

[Embodiment 4]

Figure 6A:
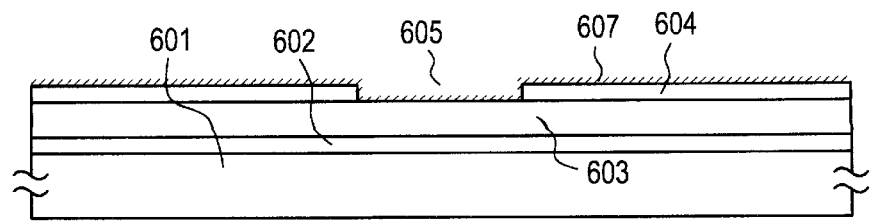
FIGS. 6A to 6E are cross-sectional views showing a manufacturing process of a semiconductor device in accordance with a fourth embodiment of the invention.
Figure 6B:
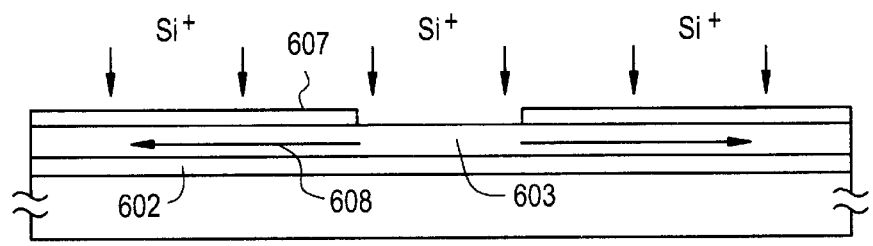

FIGS. 6A to 6E show cross-sectional views of the manufacturing process of a pair of thin film transistors in accordance with the fourth embodiment of the invention. A silicon oxide layer 602 is formed on a glass substrate 601 to a thickness of 1000–5000 Å, for example 2000 Å. Then, an amorphous silicon layer 603 is formed through a conventional plasma CVD to a thickness of 500–1500 Å, for example, 500 Å. And then, a silicon oxide layer 604 is further formed on the amorphous silicon layer 603 to a thickness of 500–1500 Å, for example 500 Å. It is desirable to form these films successively. As shown in FIG. 6A, an opening 605 is formed in the silicon oxide layer 604 by selectively etching the layer 604 in order to introduce nickel in the later step. The opening 605 is located in such a manner that it does not overlap channel regions of the TFTs to be formed within the silicon layer 603.

After forming the opening, a layer 607 containing a nickel salt is formed on the above structure by a spin-coating method as explained below.

Initially, nickel acetate or nickel nitrate is diluted with water or ethanol so that the concentration is controlled to be 25–200 ppm, for example 100 ppm. On the other hand, the substrate is immersed into a hydrogen peroxide or a mixture of hydrogen peroxide and ammonium to form an extremely thin silicon oxide layer on the exposed portion of the amorphous silicon film (in the opening 605). This will improve the interfacial affinity between the nickel solvent and the amorphous silicon layer.

Then, the substrate is placed on a spin coater and slowly rotated. The above obtained nickel solvent is dropped onto the rotating substrate at 1–10 ml, for example, 2 ml in order to spread the solvent on the entire surface of the substrate. This condition is maintained for 1–10 minutes, for example, 5 minutes. Subsequently, the rotation speed of the substrate is increased and a spin dry is performed. These steps may be performed repeatedly. Thus, a thin film 607 of a nickel salt is obtained as shown in FIG. 6A.

Next, an implantation of silicon ions is performed by an ion implantation method. At this time, the implantation is performed in such a manner that the concentration of the silicon ions is maximum at the boundary between the underlying silicon oxide layer 602 and the amorphous silicon layer 603 in the region covered with the silicon oxide 604. In the region under the opening 605, the silicon ions are more deeply implanted.

Then, the substrate is heated in a furnace at 520°–580° C., for example 550° C. and for 4–12 hours, for example 8 hours. The surrounding atmosphere is nitrogen. As a result, the nickel initially diffuses into the region of the amorphous silicon under the opening 605 and a crystallization starts there. Further, the crystallization spreads to its surrounding portion as shown by arrows in FIG. 6B.

Figure 6C:
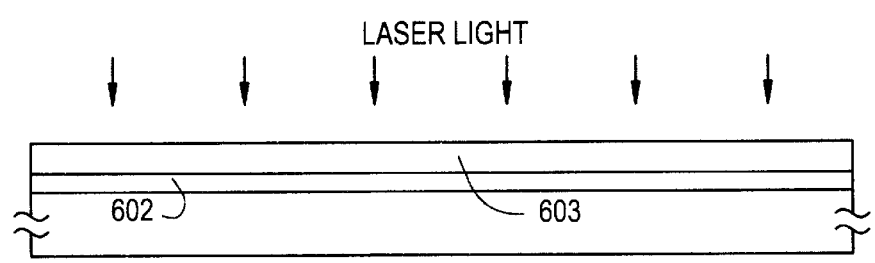

Then, in order to improve the crystallinity of the silicon layer, the layer is irradiated with KrF excimer laser (wavelength: 248 nm) or XeCl excimer laser (wavelength: 308 nm) at 1–20 shots, for example, 5 shots in air or oxygen atmosphere. (FIG. 6C)

Then, the silicon layer 603 is etched to form TFT regions. A silicon oxide layer 609 is formed on the entire surface to a thickness of 1000–1500 Å, for example, 1200 Å. Also, in the same manner as in Embodiment 1, a gate electrode 610 for a PTFT and a gate electrode 613 for an NTFT made of aluminum, an anoxic oxidation film 612, 614 are formed to obtain a gate portion of the TFT.

Figure 6D:
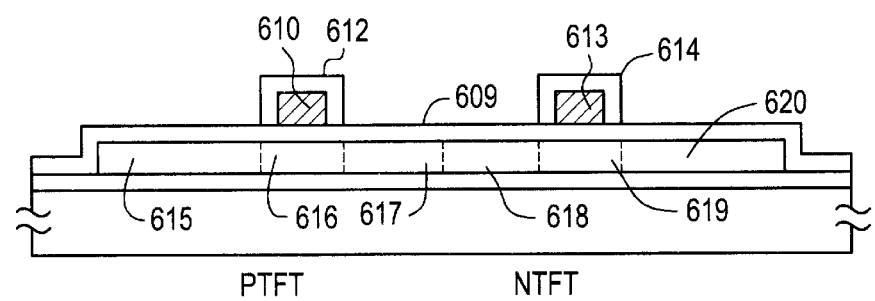

Then, an n-type impurity and a p-type impurity are respectively introduced into the semiconductor layer by using the gate portion as a mask. As a result, source 615, channel 616, drain 617 of the PTFT and source 620, channel 619 and a drain 618 of the NTF for a peripheral circuit are formed. Subsequently, a laser irradiation is performed on the entire surface of the structure in order to activate the doped impurity in the same manner as in the first embodiment. (FIG. 6D)

Figure 6E:
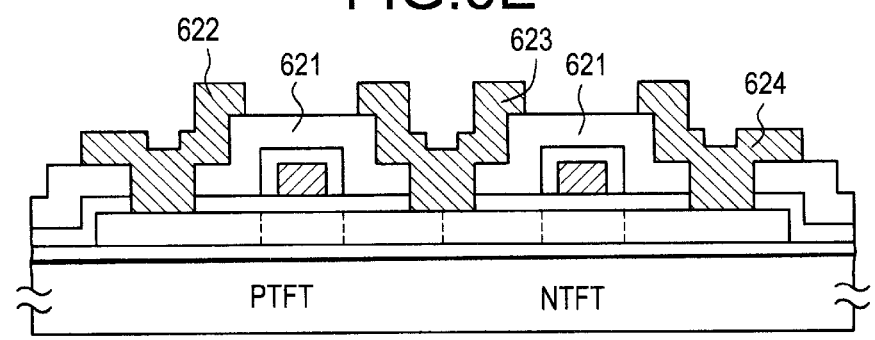

Finally, a silicon oxide layer 621 is formed to a thickness of 3000–8000 Å, for example, 5000 Å as an interlayer insulating film, following which contact holes are opened for source and drain regions of the TFTs, and a double-layer of titanium nitride (1000 Å thick) and aluminum (5000 Å) are deposited by sputtering to form electrode/wirings 622–644. In the manner described above, an invertor circuit of a PTFT and an NTFT comprising a crystalline silicon in which the crystal growth occurred in a lateral direction. (FIG. 6E)

As explained above in conjunction with FIG. 6C, since a laser irradiation is performed in this embodiment, the amorphous components remaining in a space between the needle-like crystals can be further crystallized. Moreover, this crystallization proceeds in such a manner that a cross-sectional area of the needle-like crystals become larger. This means that the region in which electrical current is to be passed is expanded and thus a more large drain current can be obtained.

Figure 7A:
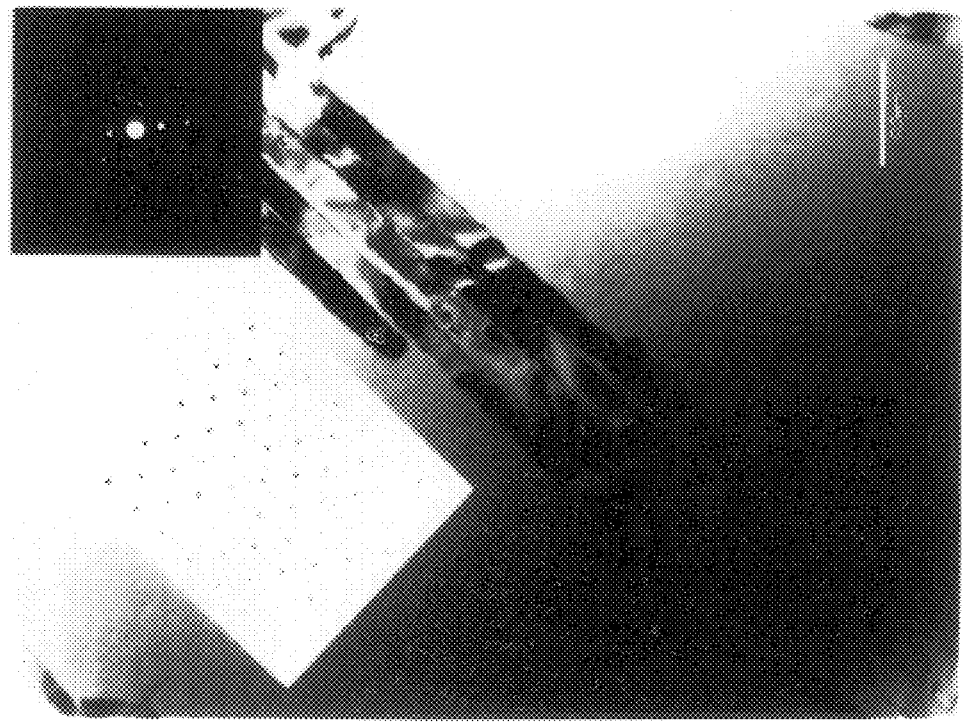
FIGS. 7A and 7B are TEM photographs of the semiconductor layer obtained in the fourth embodiment of the invention.
Figure 7B:
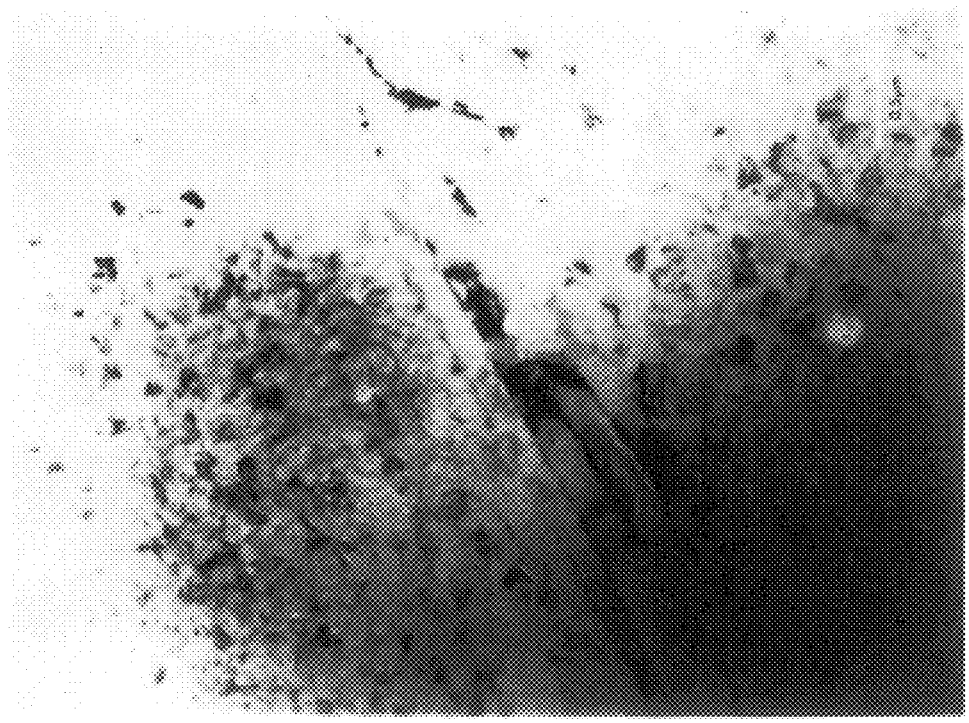

The above condition is shown in FIGS. 7A and 7B which are photographs of the silicon crystals observed with a transmission type electron microscopy (TEM). In FIG. 7A, top ends of the needle-like crystals are seen. As can been seen, the crystals grew in a lateral direction and also, there are number of amorphous regions between the crystals. This condition is observed after the heat crystallization.

FIG. 7B shows the condition when the foregoing semiconductor layer was further irradiated with a laser light in accordance with the present invention. It is observed that the amorphous region which occupies the most area of the semiconductor layer was crystallized. Most of this crystallization was randomly proceeded and an electrical property is not so good. However, it should be noted that the amorphous region intervening between the crystals as shown in FIG. 7A was crystallized based on the already formed needle-like crystals. Accordingly, a more large crystalline region in which the crystalline orientation is substantially uniform can be obtained by the subsequent laser irradiation.

FIGS. 7A and 7B are directed to the top ends of the crystals where there are observed relatively a lot of amorphous regions for the purpose of easier understanding of the above phenomena. However, the same applies to the bottom portion or a middle portion of the crystals.

According to this invention, by selectively introducing metal element promoting crystallization into a specific area and starting crystal growth from this area in a lateral direction (in parallel to a substrate), a crystal silicon film having uniform crystal growth direction can be obtained. In this case, in order to beforehand extinguish crystal components at an area where the lateral crystal growth progresses, this area is doped with inert ions to be perfectly made amorphous, and then subjected to a heat-annealing treatment to obtain a crystal semiconductor film having uniform crystal growth direction. If TFTs are manufactured using the film thus formed, high mobility can be provided to the TFTs.

Further, in accordance with another aspect of the invention, the laser irradiation subsequent to the heat crystallization reduces the amorphous region and make the crystals in the shape of a needle more larger. Thus, the characteristics of TFTs can be improved.

While this invention has been described above in connection with various preferred and alternative embodiments, it is understood that persons of ordinary skill in the art can make numerous modifications without departing from the scope of the invention as claimed in the appended claims.

What is claimed is:

1. A thin-film transistor comprising:
    a semiconductor layer disposed between two insulating layers, said semiconductor layer containing a catalytic material;
    source and drain regions formed in said semiconductor layer;
    a channel region positioned between said source and drain regions, said channel region being free from a portion where said catalytic material is added;
    a gate electrode formed adjacent to said channel region with one of said two insulating layers interposed therebetween,
    wherein said channel region comprises a plurality of needle-like or columnar crystals extending substantially in one direction parallel to said two insulating layers, and
    wherein said direction in which said crystals extend through the channel region is at a fixed angle with a direction in which carriers of said transistor flows.

2. The transistor of claim 1 wherein resistance against movement of the carriers in the thin film transistor depends on said fixed angle.

3. The transistor of claim 1 wherein at least one of said two insulating layers comprises silicon oxide.

4. The transistor of claim 1 wherein a concentration of said catalytic material is $1\times10^{19}$ atoms/cm$^3$ or lower.

5. A thin-film transistor comprising:
   a semiconductor layer disposed between two insulating layers, said semiconductor layer containing a catalytic material;
   source and drain regions formed in said semiconductor layer;
   a channel region positioned between said source and drain regions, said channel region being free from a portion where said catalytic material is added; and
   a gate electrode formed adjacent to said channel region with one of said two insulating films interposed therebetween,
   wherein said channel region comprises a plurality of needle-like or columnar crystals extending substantially in one direction parallel to said two insulating layers,
   wherein said direction in which said crystals extend through the channel region is at a fixed angle with a direction in which carriers of said transistor flows, and
   wherein a concentration of said catalytic material in said semiconductor layer is $1\times10^{19}$ atoms/cm$^3$ or lower.

6. The transistor of claim 5 wherein resistance against movement of the carriers in the thin film transistor depends on said fixed angle.

7. The transistor of claim 5 wherein at least one of said two insulating layers comprises silicon oxide.

8. The transistor of claim 5 wherein each edge of said source and drain regions is substantially aligned with each outer edge of said gate electrode.

9. A CMOS transistor including a p-channel type thin film transistor and a n-channel type thin film transistor connected with each other comprising;
   a semiconductor layer disposed between two insulating layers, said semiconductor layer containing a catalytic material;
   a pair of active regions formed in said semiconductor layer;
   source and drain regions formed in each of said active regions,
   a channel region positioned between said source and drain regions, said channel region being free from a portion where said catalytic material is added; and
   a gate electrode formed adjacent to said channel region with one of said two insulating layers interposed therebetween,
   wherein said channel region comprises a plurality of needle-like or columnar crystals extending substantially in one direction parallel to said two insulating layers, and
   wherein said one direction in which said crystals extend through the channel region is at a fixed angle with a direction in which carriers of said transistor flows.

10. The transistor of claim 9 wherein resistance against movement of the carriers in the thin film transistor depends on said fixed angle.

11. The transistor of claim 9 wherein at least one of said two insulating layers comprises silicon oxide.

12. The transistor of claim 9 wherein a concentration of said catalytic material is $1\times10^{19}$ atoms/cm$^3$ or lower.

13. A CMOS transistor including a p-channel type thin film transistor and a n-channel type thin film transistor connected with each other comprising;
   a semiconductor layer disposed between two insulating layers, said semiconductor layer containing a catalytic material;
   a pair of active regions formed in said semiconductor layer;
   source and drain regions formed in each of said active regions;
   a channel region positioned between said source and drain regions, said channel region being free from a portion where said catalytic material is added; and
   a gate electrode formed adjacent to said channel region with one of said two insulating layers interposed therebetween,
   wherein each inner edge of said source and drain regions in said active region is substantially aligned with each outer edge of said gate electrode,
   wherein said channel region comprises a plurality of needle-like or columnar crystals extending substantially in one direction parallel to said two insulating layers, and
   wherein said one direction in which said crystals extend through the channel region is at a fixed angle with a direction in which carriers of said transistor flows.

14. The transistor of claim 13 wherein resistance against movement of the carriers in the thin film transistor depends on said fixed angle.

15. The transistor of claim 13 wherein at least one of said two insulating layers comprises silicon oxide.

16. The transistor of claim 13 wherein a concentration of said catalytic material is $1\times10^{19}$ atoms/cm$^3$ or lower.

17. A semiconductor device comprising:
   an active layer formed from a semiconductor film, said active layer comprising at least source, drain and channel regions and disposed between two insulating layers, said semiconductor layer containing a catalytic material which is capable of promoting crystallization of said semiconductor layer; and
   a gate electrode formed adjacent to said channel region with one of said two insulating layers interposed therebetween,
   wherein said channel region comprises a plurality of needle-like or columnar crystals extending substantially in one direction parallel to said two insulating layers and is free from a portion where said catalytic material is added,
   wherein said one direction of said crystals extending is at a fixed angle with a direction in which carriers flow through said channel region, and
   wherein a concentration of said catalytic material in said semiconductor layer is $1\times10^{19}$ atoms/cm$^3$ or lower.

18. The device of claim 17 wherein said catalytic material is selected from the group consisting of Ni, Fe, Co, Pd and Pt.

19. The device of claim 17 wherein at least one of said two insulating layers comprises silicon oxide.

20. The device of claim 17 wherein said semiconductor layer is formed by laser crystallization after thermal crystallization.

21. A thin-film transistor comprising:
   an active layer formed from a semiconductor film and disposed between two insulating layers, said semiconductor film containing a catalytic material;

source and drain regions formed in said active layer;

a channel region positioned between said source and drain regions in said active layer, said channel region being free from a portion where said catalytic material is added; and a gate electrode formed adjacent to said channel region with one of said two insulating layers interposed therebetween, wherein said channel region comprises a plurality of needle-like or columnar crystals extending substantially in one direction parallel to said two insulating layers, wherein said one direction of said crystals extending is at a fixed angle with a direction in which carriers flow through said channel region, and wherein a concentration of said catalytic material in said active layer is $1 \times 10^{19}$ atoms/cm$^3$ or lower.

22. A semiconductor device comprising:

a crystalline semiconductor film formed between two insulating layers, said crystalline semiconductor film including at least source, drain and channel regions therein and having crystals extending in one direction parallel to said two insulating layers; and a gate electrode formed adjacent to said channel region with one of said two insulating layers interposed therebetween, wherein said one direction in which said crystals extend is at a fixed angle with a direction linking between said source and drain regions of said semiconductor, and wherein said semiconductor film contains a catalytic material for promoting crystallization of said semiconductor film and said channel region is free from a portion where said catalytic material is added.

23. A device according to claim 22 wherein said semiconductor film is intrinsic.

24. A device according to claim 22 wherein said catalytic material is selected from the group consisting of Ni, Fe, Co, Pd and Pt.

25. A device according to claim 24 wherein a concentration of said catalytic material is $1 \times 10^{19}$ atoms/cm$^3$ or lower.

26. A device according to claim 22 wherein each inner edge of said source and drain regions in said semiconductor film is substantially aligned with each outer edge of said gate electrode.

27. semiconductor device comprising:

an active layer formed from a semiconductor film, said semiconductor film disposed between two insulating layers and containing a catalytic material which is capable of promoting crystallization of a semiconductor film, and at least source, drain and a channel regions provided in said active layer, said channel region being free from a portion where said catalytic material is added; and a gate electrode formed adjacent to said channel region with one of said two insulating layers interposed therebetween, wherein said active layer comprises a plurality of crystals extending substantially in one direction parallel to said two insulating layers, wherein said one direction in which said crystals extend is at a fixed angle with a direction linking between said source and drain regions in said active layer, and wherein a concentration of said catalytic material in said active layer is $1 \times 10^{19}$ atoms/cm$^3$ or lower.

28. A device according to claim 27 wherein said semiconductor film is intrinsic.

29. A device according to claim 27 wherein said catalytic material is selected from the group consisting of Ni, Fe, Co, Pd and Pt.

30. A transistor according to claim 1 wherein said semiconductor layer is intrinsic.

31. A transistor according to claim 5 wherein said semiconductor layer is intrinsic.

32. A transistor according to claim 9 wherein said semiconductor layer is intrinsic.

33. A transistor according to claim 13 wherein said semiconductor layer is intrinsic.

34. A device according to claim 1 wherein said catalytic material is selected from the group consisting of Ni, Fe, Co, Pd and Pt.

35. A device according to claim 5 wherein said catalytic material is selected from the group consisting of Ni, Fe, Co, Pd and Pt.

36. A device according to claim 9 wherein said catalytic material is selected from the group consisting of Ni, Fe, Co, Pd and Pt.

37. A device according to claim 13 wherein said catalytic material is selected from the group consisting of Ni, Fe, Co, Pd and Pt.

38. A device according to claim 21 wherein said catalytic material is selected from the group consisting of Ni, Fe, Co, Pd and Pt.

* * * * *